(12) United States Patent
Shen et al.

(10) Patent No.: US 10,090,338 B2
(45) Date of Patent: Oct. 2, 2018

(54) METHOD FOR MANUFACTURING ARRAY SUBSTRATE, ARRAY SUBSTRATE AND DISPLAY DEVICE

(71) Applicants: BOE TECHNOLOGY GROUP CO., LTD., Beijing (CN); Hefei BOE Display Technology Co., Ltd., Hefei, Anhui (CN)

(72) Inventors: Shifei Shen, Beijing (CN); Jeong Hun Rhee, Beijing (CN); Youngjin Song, Beijing (CN); Maomao Fang, Beijing (CN); Jianxin Hou, Beijing (CN)

(73) Assignees: BOE TECHNOLOGY GROUP CO., LTD., Beijing (CN); HEFEI BOE DISPLAY TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/229,045

(22) Filed: Aug. 4, 2016

(65) Prior Publication Data
US 2017/0263655 A1 Sep. 14, 2017

(30) Foreign Application Priority Data
Mar. 9, 2016 (CN) .......................... 2016 1 0134916

(51) Int. Cl.
*H01L 29/15* (2006.01)
*H01L 27/12* (2006.01)
(52) U.S. Cl.
CPC ........ *H01L 27/1288* (2013.01); *H01L 27/124* (2013.01); *H01L 27/1248* (2013.01)
(58) Field of Classification Search
CPC ............... H01L 27/1288; H01L 27/124; H01L 27/1248

(Continued)

(56) References Cited

U.S. PATENT DOCUMENTS

| 2009/0321740 A1* | 12/2009 | Xiao | ..................... G02F 1/1343 257/59 |
| 2011/0007234 A1* | 1/2011 | Liu | ..................... H01L 27/1214 349/43 |
| 2016/0170273 A1* | 6/2016 | Lee | ................... G02F 1/134309 349/43 |

FOREIGN PATENT DOCUMENTS

| CN | 102881688 A | 1/2013 |
| CN | 103021941 A | 4/2013 |

(Continued)

OTHER PUBLICATIONS

Second Chinese Office Action, for Chinese Patent Application No. 201610134916.5, dated Nov. 7, 2017, 14 pages.

(Continued)

*Primary Examiner* — Tu-Tu Ho
(74) *Attorney, Agent, or Firm* — Kinney & Lange, P.A.

(57) ABSTRACT

Disclosed is a method for manufacturing an array substrate, the array substrate and a display device which can reduce manufacturing steps of a color filter process and further reduce manufacturing steps of the display device, thereby saving manufacturing cost and time. The method for manufacturing the array substrate includes: forming a thin film transistor on a base substrate; forming a passivation layer having a via hole on a front side of the thin film transistor and forming a photo spacer on a front side of the passivation layer through a halftone mask patterning process. With this method for manufacturing the array substrate, there is no need to prepare the photo spacer on a back side of the color filter substrate. Therefore, it is possible to reduce manufacturing steps of a color filter process, which in turn further reduces manufacturing steps of the display device, thereby saving manufacturing cost and time.

3 Claims, 5 Drawing Sheets

(58) Field of Classification Search
USPC .......................................................... 257/72
See application file for complete search history.

(56) References Cited

FOREIGN PATENT DOCUMENTS

| | | | |
|---|---|---|---|
| CN | 103117248 A | 5/2013 |
| CN | 104091806 A | 10/2014 |
| CN | 104503150 A | 4/2015 |
| CN | 104900657 A | 9/2015 |

OTHER PUBLICATIONS

First Chinese Office Action, for Chinese Patent Application No. 201610134916.5, dated Jul. 4, 2017, 16 pages.

* cited by examiner

… (1)

METHOD FOR MANUFACTURING ARRAY SUBSTRATE, ARRAY SUBSTRATE AND DISPLAY DEVICE

CROSS-REFERENCE TO RELATED APPLICATION

This application claims the benefit of Chinese Patent Application No. CN201610134916.5 filed on Mar. 9, 2016 in the State Intellectual Property Office of China, the whole disclosure of which is incorporated herein by reference.

BACKGROUND OF THE INVENTION

Field of the Invention

Embodiments of the present invention relate to field of display technique, in particular to a method for manufacturing an array substrate, an array substrate and a display device.

Description of the Related Art

In a tablet display device, a Thin Film Transistor Liquid Crystal Display (TFT-LCD) has held dominant position in the current tablet display market due to its small volume, low power consumption, relatively lower manufacturing cost, free of radiation and the like.

During preparing the TFT-LCD, preparing a photo spacer (PS) located between an array substrate and a color filter substrate is a very important process. The photo spacer can ensure a uniform gap between the array substrate and the color filter substrate. At the same time, the photo spacer can also support the array substrate and the color filter substrate.

In the prior art, all the photo spacers are formed during a color filter process. As shown in FIG. 1, an existing color filter substrate comprises a color filter base substrate 10, a black matrix 11 located on a back side of the color filter base substrate 10, a color filter layer 12 located on a back side of the black matrix 11 and including red, green and blue colors, a protection coating 13 located on a back side of the color filter layer 12, and photo spacers 14 located on a back side of the protection coating 13.

There is a defect in the prior art that a color filter process has too many manufacturing steps, which results in a complicated manufacturing process of a display device, thereby increasing manufacturing cost and wasting time.

SUMMARY OF THE INVENTION

An object of the present invention is to provide a method for manufacturing an array substrate, an array substrate and a display device which can reduce manufacturing steps of a color filter process and further reduce manufacturing steps of the display device, thereby saving manufacturing cost and time.

According to one aspect of the present invention, there is provided a method for manufacturing an array substrate comprising the steps of: forming a thin film transistor on a base substrate; forming a passivation layer having a via hole on a front side of the thin film transistor and forming a photo spacer on a front side of the passivation layer through a halftone mask patterning process.

With this method for manufacturing the array substrate, there is no need to prepare the photo spacer on a back side of the color filter substrate. Therefore, it is possible to reduce manufacturing steps of a color filter process, which in turn reduces manufacturing steps of the display device, thereby saving manufacturing cost and time.

According to an exemplary embodiment of the present invention, the step of forming a passivation layer having a via hole on a front side of the thin film transistor and forming a photo spacer on a front side of the passivation layer through a halftone mask patterning process comprises: forming a passivation layer thin film on the front side of the thin film transistor; forming a photoresist layer on a front side of the passivation layer thin film; exposing the substrate using a mask plate having a full light transmission region, a half light transmission region and a light shielding region, wherein the full light transmission region corresponds to a region on the substrate where the via hole is to be formed, and the light shielding region corresponds to a region on the substrate where the photo spacer is to be formed; performing a development treatment on the exposed substrate; performing etching and ashing treatments on the developed substrate to form the passivation layer having the via hole and the photo spacer on the front side of the passivation layer.

According to an exemplary embodiment of the present invention, the method further comprises forming a protection layer for covering the photo spacer on a front side thereof.

According to an exemplary embodiment of the present invention, the method further comprises forming a pixel electrode made of the same material as the protection layer while forming the protection layer, wherein the pixel electrode passes through the via hole to be connected with a source electrode of the thin film transistor.

According to another aspect of the present invention, there is provided an array substrate comprising a passivation layer provided with a photo spacer at a front side thereof.

In the array substrate according to embodiments of the present invention, there is no need to prepare the photo spacer on a back side of the color filter substrate, thereby reducing manufacturing steps of a color filter process, which in turn reduces manufacturing steps of the display device, thereby saving manufacturing cost and time.

According to an exemplary embodiment of the present invention, the photo spacer comprises an organic film photo spacer.

According to an exemplary embodiment of the present invention, the photo spacer comprises a photoresist photo spacer.

According to an exemplary embodiment of the present invention, the array substrate further comprises a protection layer for covering the photo spacer.

According to an exemplary embodiment of the present invention, the array substrate further comprises a thin film transistor located on a back side of the passivation layer and a pixel electrode located on a front side of the passivation layer, wherein the passivation layer has a via hole corresponding to a position of a source electrode of the thin film transistor, and the pixel electrode passes through the via hole to be connected with the source electrode of the thin film transistor; and the protection layer is made of the same material as the pixel electrode.

According to yet another aspect of the present invention, there is provided a display device comprising the array substrate as described above. The display device has simple manufacturing process, lower producing cost and shorter manufacturing time.

BRIEF DESCRIPTION OF THE DRAWINGS

The accompanying drawings herein can provide further understanding to embodiments of the present invention and form a part of the embodiments of the present invention.

Illustrative embodiments of the present embodiments and their description are intended to explain the present invention, rather than being construed as being restrictive.

REFERENCE LIST

Figure 1:
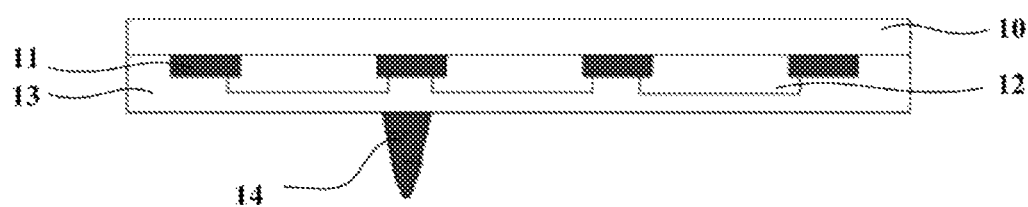
FIG. 1 is a structural schematic view of a color filter substrate in the prior art.

10: color filter base substrate
11: black matrix
12: color filter
13: protection coating
14: photo spacer
30: base substrate
31: gate line layer
32: gate insulation layer
33: data line layer
34: passivation layer
40: photoresist
330: source electrode
340: via hole
35: photo spacer
36: pixel electrode
37: protection layer
38: active layer

DETAILED DESCRIPTION OF PREFERRED EMBODIMENTS OF THE INVENTION

Embodiments of the present invention provide a method for manufacturing an array substrate, an array substrate and a display device which can reduce manufacturing steps of a color filter process and reduce manufacturing steps of the display device, thereby saving manufacturing cost and time.

Figure 2:
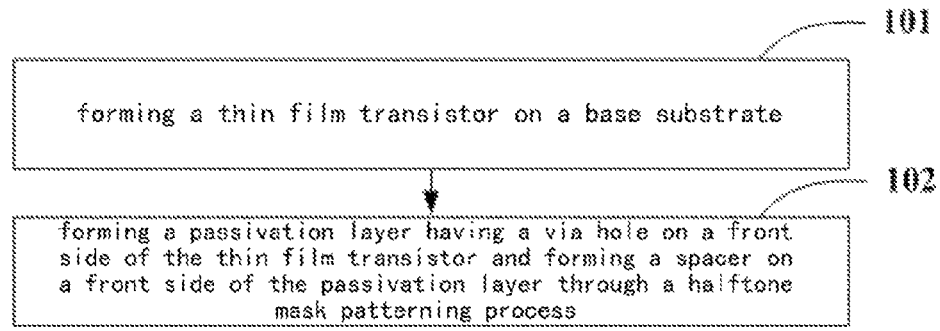
FIG. 2 is a flow chart of a method for manufacturing an array substrate according to an exemplary embodiment of the present invention.

As shown in FIG. 2, a method for manufacturing an array substrate according to an exemplary embodiment of the present invention comprises:

step 101: forming a thin film transistor on a base substrate; and step 102: forming a passivation layer having a via hole on a front side of the thin film transistor and forming a photo spacer on a front side of the passivation layer through a halftone mask patterning process.

In embodiments of the present invention, the term "front side" should be understood as a side of a display device close to a viewer, and the term "back side" should be understood as a side of the display device away from the viewer. The terms "front side" and "back side" should be interpreted based on this definition, unless stated otherwise below.

With this method for manufacturing the array substrate, there is no need to prepare the photo spacer on a back side of the color filter substrate, thereby reducing manufacturing steps of a color filter process, which in turn reduces manufacturing steps of the display device, thereby saving manufacturing cost and time.

Figure 3:
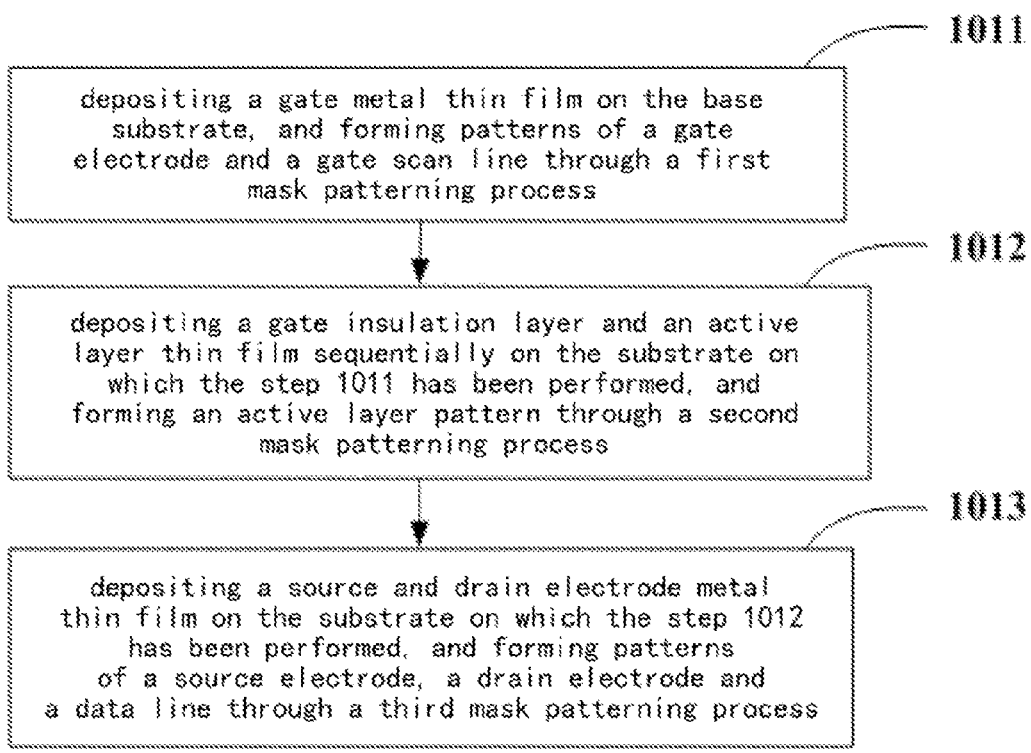
FIG. 3 is a flow chart of the step 101 as shown in FIG. 2.
Figure 4:
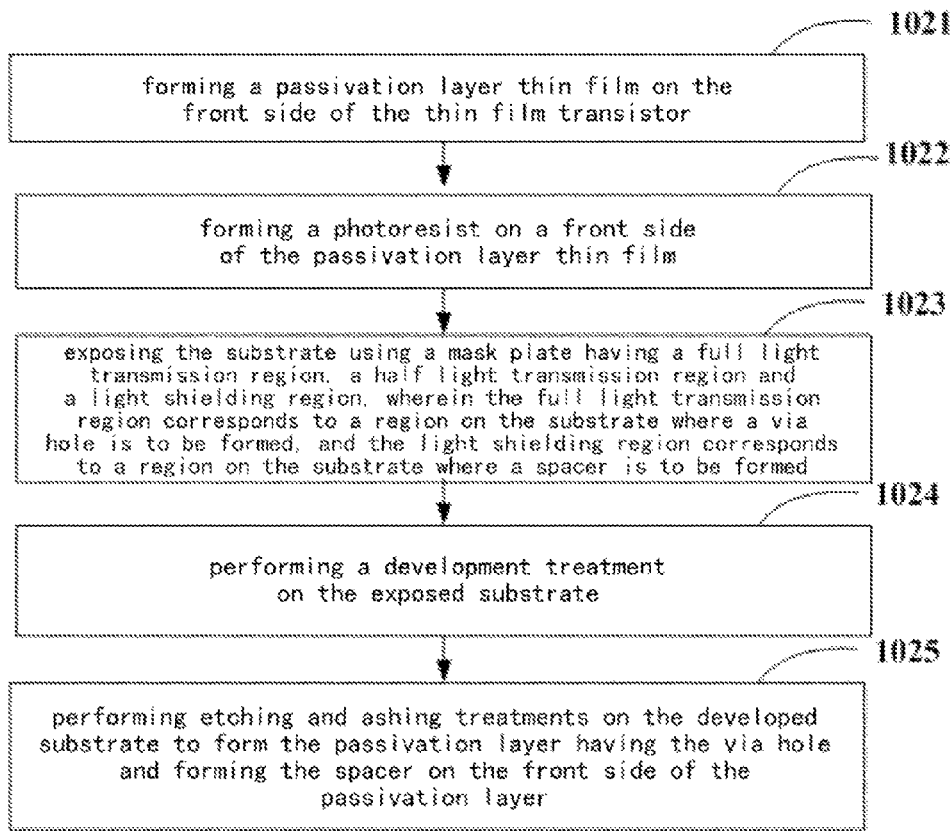
FIG. 4 is a flow chart of the step 102 as shown in FIG. 2.

Specifically, as shown in FIG. 3, the step 101 comprises:

step 1011: depositing a gate metal thin film on the base substrate, and forming patterns of a gate electrode and a gate scan line through a first mask patterning process.

The gate metal thin film may include a single layer thin film of aluminum, chromium, tungsten, tantalum, titanium, molybdenum or molybdenum nickel or a multilayer composite thin film consisting of the single layer thin film as described above. The metal thin film may be formed through a physical vapor deposition process.

step 1012: depositing a gate insulation layer and an active layer thin film sequentially on the substrate on which the step 1011 has been performed, and forming an active layer pattern through a second mask patterning process.

An insulation component of the gate insulation layer may include silicon oxide or the like and the gate insulation layer may be formed through a chemical vapor deposition process. The active layer thin film may be made of amorphous silicon, hydrogenated amorphous silicon or the like and formed through the chemical vapor deposition process.

step 1013: depositing source and drain electrode metal thin films on the substrate on which the step 1012 has been performed, and forming patterns of a source electrode, a drain electrode and a data line through a third mask patterning process, The source and drain electrode metal thin film may include a single layer thin film of aluminum, chromium, tungsten, tantalum, titanium, molybdenum or molybdenum nickel or a multilayer composite thin film consisting of the single layer thin film as described above. The metal thin film may be formed through the physical vapor deposition process.

Figure 6A:
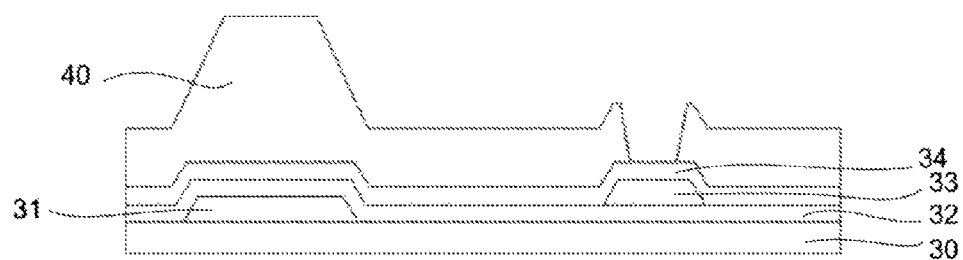
FIG. 6a-6c are schematic views of a halftone mask process of a substrate according to an exemplary embodiment of the present invention.
Figure 6B:
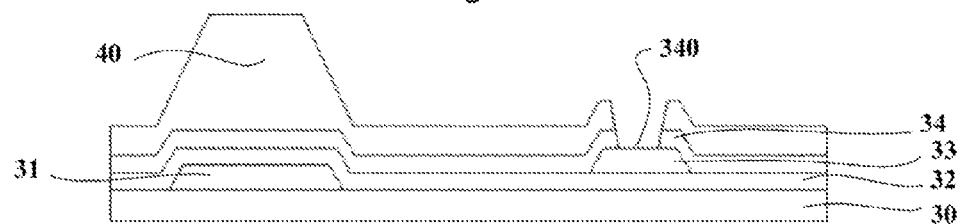
Figure 6C:
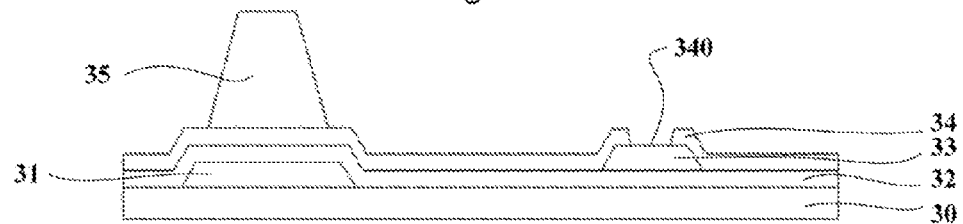

Specifically, as illustrated in FIGS. 4 and 6a to 6c, the step 102 may include:

step 1021: forming a passivation layer thin film on the front side of the thin film transistor;

step 1022: forming a photoresist 40 on a front side of the passivation layer thin film, as shown in FIG. 6a;

step 1023: exposing the substrate using a mask plate having a full light transmission region, a half light transmission region and a light shielding region, wherein the full light transmission region corresponds to a region on the substrate where the via hole 340 is to be formed, and the light shielding region corresponds to a region on the substrate where the photo spacer is to be formed, as shown in FIG. 6b;

step 1024: performing a development treatment on the exposed substrate;

step 1025: performing etching and ashing treatments on the developed substrate to form the passivation layer 34 having the via hole 340 and the photo spacer 35 on the front side of the passivation layer, as shown in FIG. 6c.

With this method for manufacturing the array substrate, it is possible to reduce the processing procedures of the color filter process. At the same time, the etching and ashing may be performed in the same process when preparing the photo spacer by the halftone mask patterning process. Therefore, compared to the prior art, it is possible to avoid a photoresist peeling step after the etching. Thus, the manufacturing process of the TFT-LCD is simplified, thereby greatly saving manufacturing cost and time.

In another embodiment of the present invention, the method for manufacturing the array substrate further comprises forming a protection layer for covering the photo spacer on a front side of the photo spacer. In this embodiment, since the photo spacer has the protection layer on the surface thereof, the protection layer can protect the photo spacer from being affected by a photoresist peeling liquid during forming other layer structures through a mask patterning process in the subsequent steps.

Figure 5:
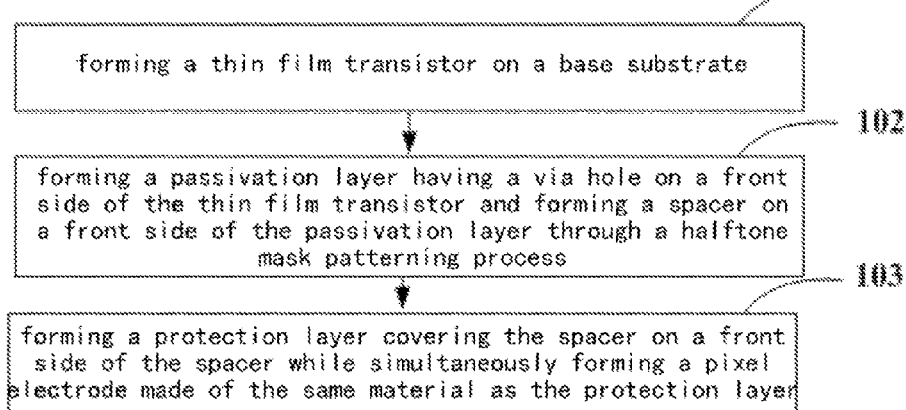
FIG. 5 is a flow chart of a method for manufacturing an array substrate according to another exemplary embodiment of the present invention.

Please refer to FIG. 5, in an exemplary embodiment of the present invention, a method for manufacturing an array substrate comprises:

step 101: forming a thin film transistor on a base substrate;

step 102: forming a passivation layer having a via hole on a front side of the thin film transistor and forming a photo spacer on a front side of the passivation layer through a halftone mask patterning process; and step 103: forming a protection layer for covering the photo spacer on a front side thereof while simultaneously forming a pixel electrode made of the same material as the protection layer, the pixel electrode passing through the via hole to connect with a source electrode of the thin film transistor.

With this method, it is possible to form the protection layer and the pixel electrode in a single mask patterning process, thereby greatly simplifying the manufacturing process of the array substrate and further shortening the manufacturing time.

Figure 7:
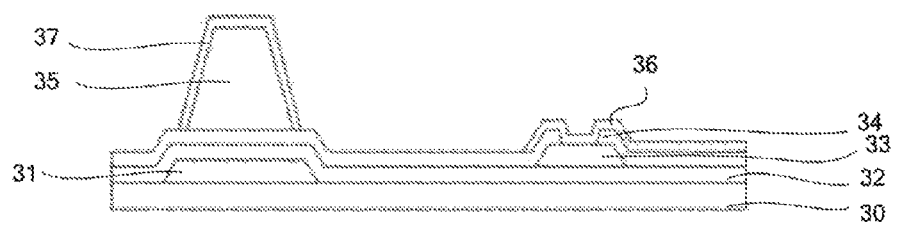
FIG. 7 is a schematic cross-section view of an array substrate according to an exemplary embodiment of the present invention.

As shown in FIG. 7, an array substrate according to an exemplary embodiment of the present invention comprises a passivation layer 34 provided with a photo spacer 35 on a front side thereof.

The array substrate according to embodiments of the present invention is not restrictive. For example, the array substrate may be a bottom-gate type array substrate (in this case, the active layer is located above the gate line layer) or a top-gate type array substrate (in this case, the active layer is located below the gate line layer). The positions of the respective layers of the array substrate may be varied as long as essential elements for driving the display device such as the gate electrode, the active layer, the source electrode, the drain electrode, the pixel electrode and the like are formed to ensure normal drive of the display device.

Figure 8:
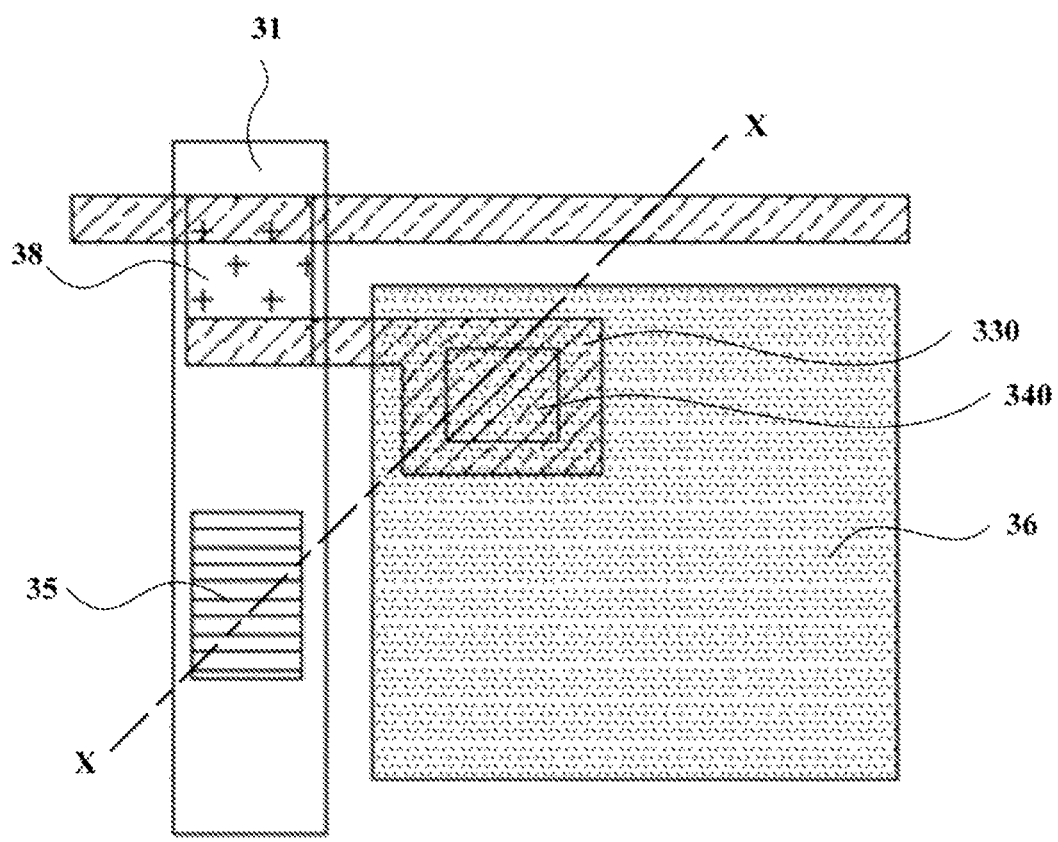
FIG. 8 is a top view of the array substrate of FIG. 7, in which a line X-X is shown as a cross section line of FIG. 7.

Taking the bottom-gate type array substrate as an example, please refer to FIGS. 7 and 8, an array substrate according to an exemplary embodiment of the present invention comprises:

a base substrate 30;

a gate line layer 31 located on a front side of the base substrate 30;

a gate insulation layer 32 located on a front side of the gate line layer 31;

an active layer 38 (FIG. 8) located on a front side of the gate insulation layer 32;

a data line layer 33 located on a front side of the active layer;

a passivation layer 34 located on a front side of the data line layer 33, the passivation layer 34 having a via hole 340 and a photo spacer 35 formed on a front side of the passivation layer 34;

a pixel electrode 36 connected with a source electrode 330 in the data line layer 33 through the via hole 340.

In this embodiment of the present invention, there is no need to prepare the photo spacer on a back side of a color filter substrate. Therefore, it is possible to reduce manufacturing steps of a color filter process, which in turn reduces manufacturing steps of the display device, thereby saving manufacturing cost and time.

A material of the pixel electrode 36 is not restrictive. For example, the pixel electrode may be made of metallic oxide such as tin indium oxide (TIO) or the like. The pixel electrode may also be made of metal such as molybdenum-antimony metal layer or the like. The type of the photo spacer 35 is not restrictive. For example, the photo spacer may be an organic film photo spacer, or a photoresist photo spacer or the like.

When the photo spacer is the photoresist photo spacer, the array substrate further comprises a protection layer 37 for covering the photo spacer. Since the photo spacer has the protection layer on the surface thereof, the protection layer can protect the photo spacer from being affected by a photoresist peeling liquid during forming other layer structures through a mask patterning process in the subsequent steps.

When the photo spacer is the organic film photo spacer, since the organic film does not react with the phtotresist peeling liquid, the subsequent mask patterning process will not affect the organic film photo spacer. Therefore, there is no need to form a protection layer on the organic film photo spacer.

In an exemplary embodiment of the present invention, the protection layer 36 is made of the same material as the pixel electrode. Therefore, it is possible to forming the protection layer and the pixel electrode in a single mask patterning process, and thus further simplifying the manufacturing process of the array substrate and shortening the manufacturing time.

According to an exemplary embodiment of the present invention, there is also provided a display device comprising the array substrate according to any embodiment as described above. The type of the display device is not restrictive. The display device may include a liquid crystal panel, an electronic paper, an OLED panel, a mobile phone, a tablet computer, a television, a monitor, a laptop, a digital photo frame, a navigator and other products or components having display function. This display device has simple manufacturing process, lower producing cost and shorter manufacturing time.

Obviously, those skilled in the art can make various changes or modifications to the present invention without departing from the principle and spirit thereof. In this way, if these changes or modifications fall into the scope of the present invention and its equivalent, the present invention is intended to cover these changes or modifications.

What is claimed is:

1. A method for manufacturing an array substrate, comprising:

forming a thin film transistor on a base substrate; and forming a passivation layer having a via hole therein on a front side of the thin film transistor and forming a photo spacer on a front side of the passivation layer through a halftone mask patterning process, comprising:

forming a passivation layer thin film on the front side of the thin film transistor;

forming a photoresist on a front side of the passivation layer thin film;

exposing the substrate using a mask plate having a full light transmission region, a half light transmission region and a light shielding region, wherein the full light transmission region corresponds to a region on the substrate where the via hole is to be formed, and the light shielding region corresponds to a region on the substrate where the photo spacer is to be formed, and wherein the full light transmission region is at least partially spaced apart from the light shielding region by the half light transmission region of the mask plate such that a region on the substrate where the half light transmission region corresponds to is arranged at least partially between the region on the substrate where the via hole is to be formed and the region on the substrate where the photo spacer is to be formed;

performing a development treatment on the exposed substrate;

performing etching and ashing treatments on the developed substrate to form the passivation layer having the via hole therein and form the photo spacer on the front side of the passivation layer, the via hole of the passivation layer being provided corresponding to a position of a source electrode of the thin film transistor; and forming a pixel electrode located on a front side of the passivation layer, the pixel electrode passing through the via hole to be connected with the source electrode of the thin film transistor.

2. The method according to claim 1, further comprising:

forming a protection layer on a front side of the photo spacer to cover the photo spacer.

3. The method according to claim 2, further comprising:

forming a pixel electrode made of the same material as the protection layer while forming the protection layer, wherein the pixel electrode passes through the via hole to be connected with a source electrode of the thin film transistor.

* * * * *